United States Patent
Knierim et al.

(10) Patent No.: US 10,330,705 B2
(45) Date of Patent: Jun. 25, 2019

(54) CALIBRATION FOR TEST AND MEASUREMENT INSTRUMENT INCLUDING ASYNCHRONOUS TIME-INTERLEAVED DIGITIZER USING HARMONIC MIXING

(71) Applicant: Tektronix, Inc., Beaverton, OR (US)

(72) Inventors: Daniel G. Knierim, Beaverton, OR (US); Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 196 days.

(21) Appl. No.: 15/391,637

(22) Filed: Dec. 27, 2016

(65) Prior Publication Data

US 2017/0176499 A1    Jun. 22, 2017

Related U.S. Application Data

(63) Continuation of application No. 14/971,727, filed on Dec. 16, 2015, now Pat. No. 9,568,503.

(51) Int. Cl.
| | | |
|---|---|---|
| *G01R 13/02* | (2006.01) | |
| *H03M 1/12* | (2006.01) | |
| *H03M 1/06* | (2006.01) | |
| *H03M 1/10* | (2006.01) | |

(52) U.S. Cl.
CPC ......... *G01R 13/0272* (2013.01); *H03M 1/06* (2013.01); *H03M 1/1009* (2013.01); *H03M 1/121* (2013.01)

(58) Field of Classification Search
CPC ...... G01R 23/00; G01R 23/16; G01R 23/165; G01R 23/167; G01R 23/18; G01R 27/28; H03D 7/08; H03D 7/10
See application file for complete search history.

(56) References Cited

U.S. PATENT DOCUMENTS

2007/0262895 A1* 11/2007 Stein ................. H03M 1/0626
                                                                341/155
2010/0244811 A1    9/2010 Pupalaikis

OTHER PUBLICATIONS

Extended European Search Report and Opinion for European Patent Application EP 16175116.9, dated Nov. 21, 2016, 7 pages, European Patent Office, Munich, Germany.

* cited by examiner

*Primary Examiner* — Tung X Nguyen
(74) *Attorney, Agent, or Firm* — Miller Nash Graham & Dunn; Andrew J. Harrington

(57) ABSTRACT

A test and measurement instrument includes a coefficient storage facility coupled to a programmable filter. The coefficient storage facility is configured to store at least two pre-determined filter coefficient sets, and configured to pass a selected one of the at least two pre-determined filter coefficient sets to the filter based on a measurement derived using a compensation oscillator. The measurement may include clock delay and clock skew. In some examples the test and measurement instrument may additionally adjust clock delay and/or clock skew in addition to selecting appropriate filter coefficients.

10 Claims, 9 Drawing Sheets

CALIBRATION FOR TEST AND MEASUREMENT INSTRUMENT INCLUDING ASYNCHRONOUS TIME-INTERLEAVED DIGITIZER USING HARMONIC MIXING

CROSS-REFERENCE TO RELATED APPLICATIONS

This application is a continuation of U.S. patent application Ser. No. 14/971,727, filed Dec. 16, 2015, Now U.S. Pat. No. 9,568,503 which is a continuation-in-part of U.S. patent application Ser. No. 14/254,373, which was issued as U.S. Pat. No. 9,306,590, which is a continuation-in-part of U.S. patent application Ser. No. 13/116,234, which was issued as U.S. Pat. No. 8,742,729. This application is also related to U.S. patent application Ser. No. 14/229,307, which was issued as U.S. Pat. No. 9,432,042. The entire contents of all of these cited applications are hereby incorporated by reference into this application.

BACKGROUND

This disclosure relates to test and measurement instruments and, more particularly, to calibration of test and measurement instruments including one or more asynchronous time-interleaved digitizers, which use harmonic mixing for reducing noise.

Useable bandwidths of test and measurement instruments, such as digital oscilloscopes, can be limited by an analog to digital converter (ADC) used to digitize input signals. The useable bandwidth of an ADC can be limited to the lesser of the analog bandwidth or one half of a maximum sample rate of the ADC. Various techniques have been developed to digitize higher bandwidth signals with existing ADCs. One such technique is described in the above-referenced patent and applications, which includes splitting an input signal into a number of split signals each including substantially all of the bandwidth of the input signal. Then the split signals are respectively mixed with harmonic mixers and digitized. The digitized, split signals can be recombined to make a reconstructed input signal. This technique is referred to as ATI, or an Asynchronous Time Interleaved system.

In the event of interleaving errors due to analog mismatch of such a system, hardware adjustments can be made for mixing clock amplitude and phase. The adjustments can also be calibrated to minimize interleave mismatch spurs. Alternatively, or in addition, hardware mismatches can be characterized, and a linear, time-varying correction filter may be used to cancel the interleave spurs.

Previously, such calibration occurred at the factory before an instrument is shipped to a customer. Although the instruments are initially factory calibrated, hardware performance may drift from their calibrated state based on environmental conditions at runtime, such as temperature and humidity. Calibrating for a particular hardware state of such a sensitive device, however, requires access to a signal source that spans the full frequency range of the internal digitizer. The built-in calibration oscillators described in the '373 application, however, are not tunable over the entire range of the potential signal sources. Therefore, calibration of systems having a built-in calibration oscillator that does not span the entire range of potential signal sources suffers.

Embodiments of the invention address these and other limitations.

DETAILED DESCRIPTION

This disclosure describes embodiments of an ADC system for a test and measurement instrument using harmonic mixing.

Figure 1:
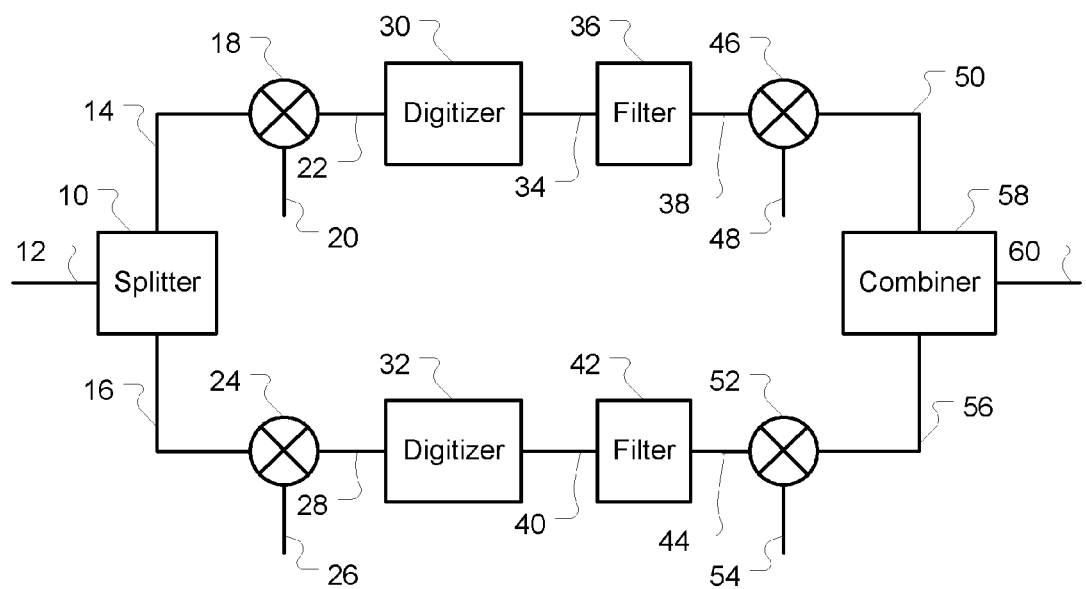
FIG. 1 is a block diagram of an ADC system for a test and measurement instrument using harmonic mixing according to an embodiment of the invention.

FIG. 1 is a block diagram of an ADC system for a test and measurement instrument using harmonic mixing according to an embodiment of the invention. In this embodiment, the instrument includes a splitter 10 configured to split an input signal 12 having a particular frequency spectrum into multiple split signals 14 and 16, each split signal including substantially the entire spectrum of the input signal 12. A splitter 10 can be any variety of circuitry that can split the input signal 12 into multiple signals. For example, the splitter 10 can be a resistive divider. Thus, substantially all frequency components of the input signal 12 can be present in each split signal 14 and 16. However, depending on the number of paths, harmonic signals used, or the like, the frequency responses for various split signals of a splitter 10 can be different.

The split signals 14 and 16 are inputs to harmonic mixers 18 and 24, respectively. Harmonic mixer 18 is configured to mix the split signal 14 with a harmonic signal 20 to generate a mixed signal 22. Similarly, harmonic mixer 24 is configured to mix the split signal 16 with a harmonic signal 26 to generate a mixed signal 28.

As used herein, a harmonic mixer is a device configured to mix a signal with multiple harmonics. Although multiplication and/or mixing has been described in connection with harmonic mixing, as will be described in further detail below, a device that has the effect of multiplying a signal with multiple harmonics can be used as a harmonic mixer.

In some embodiments, the multiple harmonics can include a zero-order harmonic, or a DC component. For example, in some embodiments, the harmonic signal 20 can be a signal represented by equation (1):

$$1 + 2\cos(2\pi F_1 t) \quad (1)$$

Here $F_1$ represents the first-order harmonic and t represents time. Thus, a signal having the form of equation (1) has harmonics at DC and at frequency $F_1$.

Harmonic signal 26 can be a signal represented by equation (2)

$$1 - 2\cos(2\pi F_1 t) \quad (2)$$

Similar to harmonic signal 20, harmonic signal 26 has harmonics at DC and frequency $F_1$. However, the first-order harmonic at frequency $F_1$ is out of phase by 180 degrees relative to the similar first-order harmonic in harmonic signal 20.

A digitizer 30 is configured to digitize mixed signal 22. Similarly, a digitizer 32 is configured to digitize mixed signal 28. The digitizers 30 and 32 can be any variety of digitizer. Although not illustrated, each digitizer 30 and 32 can have a preamplifier, filter, attenuator, and other analog circuitry as needed. Thus, the mixed signal 22 input to the digitizer 30, for example, can be amplified, attenuated, or otherwise filtered before digitization.

The digitizers 30 and 32 are configured to operate at an effective sample rate. In some embodiments, the digitizer 30 can include a single analog to digital converter (ADC). However, in other embodiments, the digitizer 30 can include multiple interleaved ADCs operating at lower sample rates to achieve a higher effective sample rate.

A first-order harmonic of at least one of the harmonic signals 20 and 26 is different from an effective sample rate of at least one of the digitizers 30 and 32. For example, the first-order harmonic $F_1$ of the harmonic signal 20 could be 34 GHz. A sample rate of the digitizer 30 could be 50 GS/s. Thus, the first-order harmonic $F_1$ is different from the effective sample rate.

In some embodiments, the first-order harmonic of a harmonic signal need not be an integer multiple or sub-multiple of the effective sample rate of the at least one of the digitizers. In other words, in some embodiments, the first-order harmonic of a harmonic signal associated with the harmonic mixers is not an integer multiple or sub-multiple of the effective sample rate of the at least one of the digitizers.

In some embodiments, the first-order harmonic of a harmonic signal can be between the effective sample rate of the at least one of the digitizers and one half of the effective sample rate of the at least one of the digitizers. In particular, as will be described in further detail below, such a frequency allows higher frequency components above and/or below the first-order harmonic to be mixed down in frequency to be below one half of the sample rate of the digitizer 30. Thus, such frequency components can be digitized effectively by the digitizer 30.

It should be understood that all bands of the input signal 12 go through all paths. In other words, when more than one channel is combined for processing a single input signal 12, each channel or path receives substantially the entire bandwidth of the input signal 12. As the input signal 12 is transmitted through all of the digitizers, the signal to noise ratio is significantly improved.

A filter 36 can be configured to filter the digitized mixed signal 34 from digitizer 30. Similarly, a filter 42 can be configured to filter the mixed signal 40 from digitizer 32. Harmonic mixers 46 and 52 are configured to mix the filtered mixed signals 38 and 44 with harmonic signals 48 and 54, respectively. In some embodiments, the harmonic signals 48 and 54 can be substantially similar in frequency and phase to the corresponding harmonic signals 20 and 26. While the harmonic signals 20 and 26 are analog signals, and the harmonic signals 48 and 54 are digital signals, the scaling factors for these harmonic signals can be the same or similar to each other. The output signals 50 and 56 are referred to as remixed signals 50 and 56. A combiner 58 is configured to combine the remixed signals 50 and 56 into a reconstructed input signal 60. In some embodiments, the combiner 58 can implement more than mere addition of signals. For example, averaging, filtering, scaling, or the like can be implemented in the combiner 58.

The filters 36 and 42, the harmonic mixers 46 and 52, harmonic signals 48 and 54, the combiner 58, and other associated elements can be implemented digitally. For example, a digital signal processor (DSP), microprocessor, programmable logic device, general purpose processor, or other processing system with appropriate peripheral devices as desired can be used to implement the functionality of the processing of the digitized signals. Any variation between complete integration to fully discrete components can be used to implement the functionality.

Some form of synchronization of the harmonic signals 20, 26, 48, and 54 is used. For example, the harmonics of the harmonic signals 20 and 26 can be locked to a clock related to the digitizers 30 and 32. In another example, the harmonic signal can be digitized. Thus, the first-order harmonic would be available to synchronize the harmonic signals 48 and 54. In another example, out-of-band tones can be added to one or more of the mixed signals 22 and 28. Using a first-order harmonic of 34 GHz, 19.125 GHz and 21.25 GHz tones, or $\%_{16}$ and $^{10}/_{16}$ of 34 GHz, can be added to the mixed signal 22. Since these tones are outside of a bandwidth of the filtering eventually established by filter 36, i.e., approximately 18 GHz depending on the transition band, the tones can have a substantially negligible effect on the reconstructed signal 60. However, as the tones can be less than a Nyquist frequency, i.e. less than 25 GHz for a 50 GS/s sample rate, the tones can be acquired by using the digitized mixed signal 34 before filtering. Regardless of the technique used, a phase and frequency relationship between the harmonic signals 20 and 26 and the digital harmonic signals 48 and 54 can be maintained.

Figure 2:
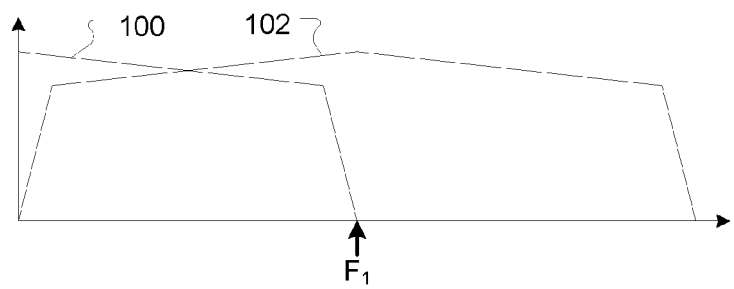
FIGS. 2-8 illustrate examples of spectral components of various signals in the ADC system for the test and measurement instrument of FIG. 1.

FIGS. 2-8 illustrate examples of spectral components of various signals in the ADC system for the test and measurement instrument of FIG. 1. Referring to FIGS. 1 and 2, spectrum 100 can be a spectrum of the input signal 12 and hence, the split signal 14. Using the above example of the harmonic signal defined in equation (1), a DC component of the split signal 14 is passed, as represented by spectrum 100. However, the spectrum 100 in the input signal 12 is also mixed with the first-order harmonic at frequency $F_1$. The resulting spectrum 102 is the product of such mixing. Thus, the mixed signal 22 includes components of spectrum 100 and spectrum 102. Here, and in other figures, the spectral components are illustrated as separate and overlapping however, the actual spectrum would be the combination of the spectra 100 and 102.

Figure 3:
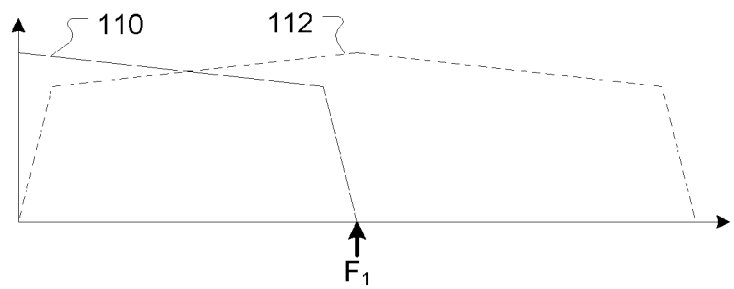

Referring to FIGS. 1 and 3, spectrum 110 similarly represents components of the mixed signal 28 due to the mixing of input signal 12 with the DC harmonic of the harmonic signal 26. However, in contrast to FIG. 2, the spectrum 112 has a 180 degree phase difference relative to the spectrum 102 of FIG. 2. As described above, the first-order harmonic of the harmonic signal 26 is phase shifted by 180 degrees from the first-order harmonic of the harmonic signal 20. This 180 degree phase shift in the harmonic signal 26 induces a 180 degree phase shift in the spectrum 112. The 180 degree phase difference is illustrated as a dashed line.

Figure 4:
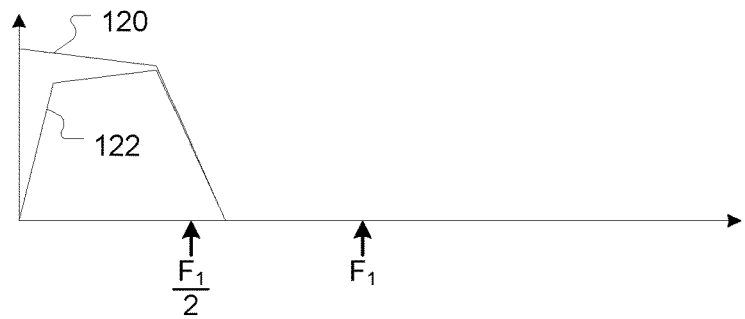
Figure 5:
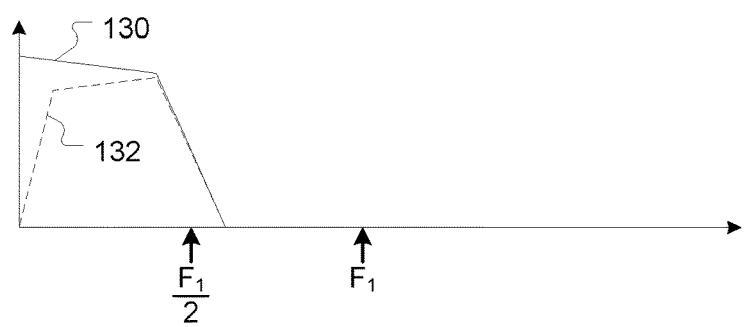

FIGS. 4 and 5 represent the spectrums of the filtered mixed signals 38 and 44. In some embodiments, the filtering can be a function of inherent filtering of the corresponding digitizers 30 and 32, the filters 36 and 42, or the like. Although filtering is illustrated in FIG. 1 as occurring after the digitizers 36 and 42, filtering can be performed in other locations. For example, some filtering can occur prior to digitization. The mixed signals 22 and 28 could be filtered with a low pass filter having a cutoff frequency near one half of the effective sample rate of the digitizers 30 and 32. The filtering of filters 36 and 42 can add to such inherent and/or induced filtering.

In some embodiments, the net filtering of the mixed signals 22 and 28 can result in a frequency response that is substantially complementary about one half of a frequency of the first-order harmonic of the harmonic signals 20 and 26. That is, the frequency response at a given offset higher than frequency $F_1/2$ and the frequency response at a given offset lower than frequency $F_1/2$ can add to one. Although one has been used as an example, other values can be used as desired, such as for scaling of signals. Furthermore, the above example is described as an ideal case. That is, the implemented filtering can have different response to account for non-ideal components, calibration, or the like.

In a particular example of the frequency response, using the 34 GHz $F_1$ described above, frequency $F_1/2$ can be 17 GHz. From DC to 16 GHz the frequency response can be one. From 16 to 18 GHz, the frequency response can linearly change from one to zero, passing through ½ at 17 GHz.

The resulting spectral components in FIG. 4, representing the filtered mixed signal 38 include a lower frequency portion of spectrum 100, illustrated by spectrum 120, and a lower frequency portion of spectrum 102, illustrated by spectrum 122. Note that due to the mixing, spectrum 122 includes frequency components of a higher sub-band of spectrum 100, albeit reversed in frequency. Similarly, the spectral components 130 and 132 of FIG. 5 correspond to the lower frequency components of spectra 110 and 112 of FIG. 3. The 180 degree phase relationship of spectrum 112 is preserved in spectrum 132.

Accordingly, through the harmonic mixing, two sub-bands of an input signal 12 have been digitized even though the span of the sub-bands would have exceeded a Nyquist bandwidth associated with the digitizers 30 and 32. In this embodiment, each mixed signal, whether analog, digital, filtered, or the like, includes components of each sub-band of the input signal 12. That is, in this example, each signal from the mixed signals 22 and 28 to the filtered digitized mixed signal 38 and 44 includes both a low frequency sub-band and a high frequency sub-band of spectrum 100.

In particular, the sub-bands of the input signal 12 have been frequency shifted to be within the bandwidth of a baseband sub-band. In some embodiments, each sub-band of the input signal 12 can be frequency shifted to be within the bandwidth of the single sub-band. However, depending on the number of sub-bands, and the harmonic signals, each sub-band may not be present in each mixed signal.

Figure 6:
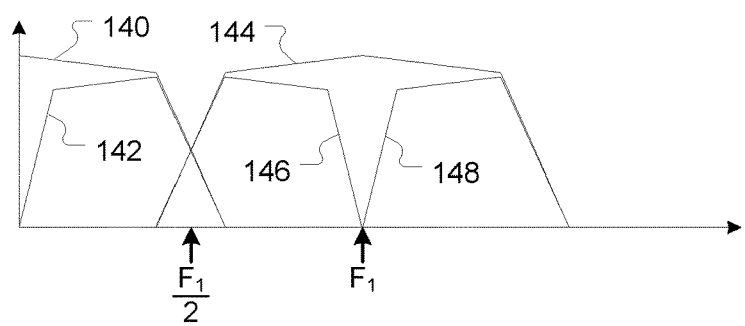
Figure 7:
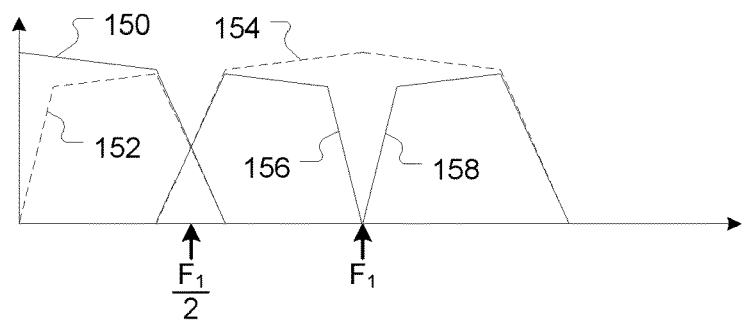

FIGS. 6 and 7 represent the spectra of the remixed signals 50 and 56. Referring to FIGS. 1 and 6, the spectrum 50 represents the remixed signal 50. As described above the filtered digitized mixed signal 38 can be mixed in the harmonic mixer 46 with the harmonic signal 48 that is substantially similar in frequency and phase to the harmonic signal 20. Accordingly, the spectra of FIG. 4 are mixed with a DC component and a first-order harmonic.

Spectra 140 and 142 represent the spectra from mixing the spectra 120 and 122 of FIG. 4 with the DC component. Spectrum 144 represents the result of mixing the spectrum 120 with the first-order harmonic. Spectra 146 and 148 represent the mixing of spectrum 122 of FIG. 4 with the first-order harmonic.

Similarly, FIG. 7 represents the spectra of the remixed signal 56. Spectra 150 and 152 represent the mixing of the DC component with the spectra of FIG. 5. Spectrum 154 represents the mixing of the first-order harmonic of the harmonic signal 54 with the spectrum 130 of FIG. 5. In particular, as the first-order harmonic of harmonic signal 54 has a relative 180 degree phase shift, the resulting spectrum 154 also has a 180 degree phase shift, represented by the dashed line.

Spectrum 132 of FIG. 5 is also mixed with the first-order harmonic of harmonic signal 54; however, the spectrum 132 already had a 180 degree induced phase shift. Thus, the additional 180 degree phase shift results in an effective 0 degree phase shift, represented by the solid line of spectra 156 and 158.

Figure 8:
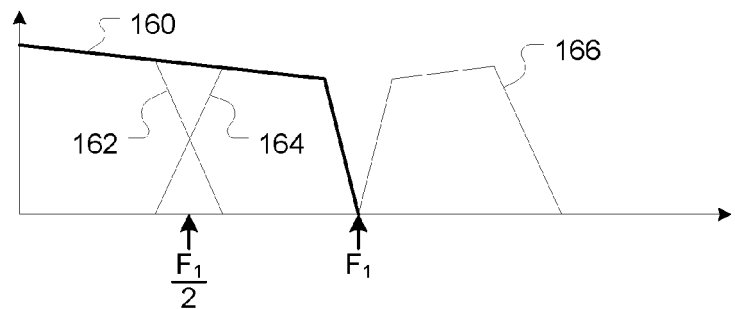

FIG. 8 illustrates a spectrum 160 of the reconstructed input signal 60 of FIG. 1. Spectra 162 and 164 represent the component sub-bands forming the spectrum 160. Spectrum 166 represents an additional sideband from the mixing described with respect to FIGS. 6 and 7. In this embodiment, spectrum 166 can be filtered out; however, in other embodiments sub-bands can extend beyond the first-order harmonic frequency $F_1$. In such an embodiment, spectrum 166, being generated from a lower frequency sub-band, can be eliminated through destructive combination.

Due to the relative phasing of the components of the remixed signals 50 and 56, sub-bands in their original frequency range combine constructively, while sub-bands outside of their original frequency range are phased to combine destructively. Referring to FIGS. 6-8, when combined, spectra 140 and 150 combine constructively, resulting in spectrum 162. Spectra 142 and 152 combine destructively as the spectra are out of phase by 180 degrees. Thus, of the spectra within the baseband sub-band, the remaining sub-band is the original sub-band.

Similarly, for the sub-band from approximately $F_1/2$ to $F_1$, spectra 146 and 156 combine constructively into spectrum 164, while spectra 144 and 154 combine destructively. Spectra 148 and 158 combine constructively into spectrum 166; however, spectrum 166 can be filtered out as it is beyond the expected input frequency range which in this case is about less than frequency $F_1$.

As illustrated by spectra 162 and 164, a transition occurs around frequency $F_1/2$. This transition is the result of the filtering described above in reference to FIGS. 4 and 5. In particular, the slopes of spectrum 162 and spectrum 164 are complementary. Thus, when the frequency components of the spectrums 162 and 164 are combined, the resulting portion of the spectrum 160 substantially matches the original frequency spectrum.

Accordingly, by mixing the input signal 12 with various harmonic signals, sub-bands of the input signal 12 can be passed through the lower bandwidth of a digitizer. Although the mixed signals included overlapping sub-bands, because of the phasing of the harmonic signals, the sub-bands combine constructively and destructively when combined as described above to create a substantially accurate representation of the input signal 12.

FIGS. 9-12 are block diagrams of examples of harmonic mixers of FIG. 1. In some embodiments, a mixer can be used to mix the split signals 14 and 16 with the respective harmonic signals 20 and 26. A mixer that can pass DC and baseband signals on all ports can be used as a harmonic mixer.

Figure 9A:
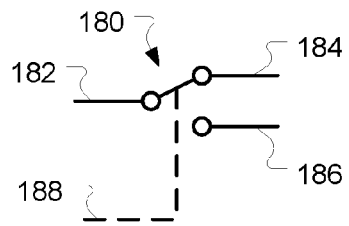
FIGS. 9-12 are block diagrams of examples of harmonic mixers of FIG. 1.
Figure 9B:
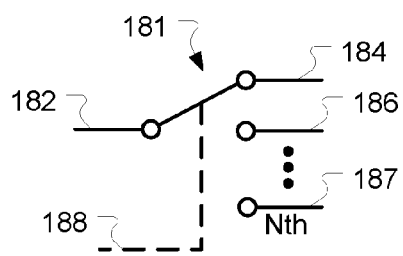

FIGS. 9A and 9B illustrate examples of a harmonic mixer, which can represent any one or more of the harmonic mixers 18, 24, 46, and/or 52 discussed above. FIG. 9A illustrates a 2-way time-interleaving switch. FIG. 9B illustrates an N-way time-interleaving switch.

In these embodiments, switches 180 and/or 181 are configured to receive an input signal 182. When using the 2-way switch 180, the input signal 182 is switched to outputs 184 and 186 in response to a control signal 188. When using the N-way switch 181, the input signal 182 is switched to the outputs 184, 186, on through to the Nth output 187, in response to the control signal 188. For example, the switch 181 can be a three-throw switch, a four-throw switch, etc., up to an N-throw switch, which causes the input signal 182 to spend 1/Nth of its time at each point or output. As further paths and sub-bands are added, the harmonics of the harmonic signals can be appropriately phased. In some embodiments, the relative phase shifts of the harmonic signals can be spaced in phase by time shifts of one period divided by the number of sub-bands.

As the pulses get shorter compared to the overall clock cycle, the harmonic content gets richer. For instance, for a two-way or a three-way switch, the zero-order harmonic (DC) and the first-order harmonic are used. For a four-way or five-way switch, the zero-order harmonic, the first-order harmonic, and a second-order harmonic can be used. For a six-way or seven-way switch, the zero-order harmonic, the first-order harmonic, a second-order harmonic, and a third-order harmonic can be used. As N increases, the pulses get narrower, thereby generating the richer harmonic content. The control signal 188 can be a signal having a fundamental frequency of the first-order harmonic, or other suitable harmonic frequency, described above.

All bands of the input signal 182 go through all paths, i.e., to each of the outputs paths (e.g., 184, 186, through the Nth output 187).

For example, referring to switch 180, the control signal 188 can be a square wave with a fundamental frequency of 34 GHz. As a result of the switching, output 184 will receive the input signal 182 during one half-cycle of the control signal and will be approximately zero during the opposite half-cycle. In effect, the output 184 is the input signal 182 multiplied by a square wave oscillating between zero and one at 34 GHz. Such a square wave can be represented by equation (3).

$$0.5 + \frac{2}{\pi}\sin(2\pi F_1 t) + \frac{2}{3\pi}\sin(6\pi F_1 t) + \ldots \quad (3)$$

Equation (3) is the Taylor series expansion of such a square wave. The DC and first two harmonics are listed. Here $F_1$ is 34 GHz. Although the magnitudes of the components are different, equations (1) and (3) include similar harmonics.

Output 186 is similar to output 184; however, the time period over which the input signal 182 is routed to the output 186 is inverted relative to output 184. The effect is again similar to multiplying the input signal 182 with a square wave defined by equation (4).

$$0.5 - \frac{2}{\pi}\sin(2\pi F_1 t) - \frac{2}{3\pi}\sin(6\pi F_1 t) + \ldots \quad (4)$$

Similar to equation (3), equation (4) is similar to the harmonic signal described in equation (2) above. Thus, the multiplication effect of the switching of the switch 180 is substantially similar to the mixing of a split signal with the harmonic signal described above. In addition, in this example, the switch can act as both the splitter 10 and harmonic mixers 18 and 24. However, in other embodiments, the switch 180 could be a single pole single throw switch and act as a single harmonic mixer.

Although the relative magnitudes of the DC component and the first-order harmonic are different, such imbalance can be corrected through a compensation filter in the appropriate path. For example, the sub-band described above between frequency $F_1/2$ and frequency $F_1$ can have a different gain applied during recombination in the combiner 58 than a baseband sub-band.

In addition, equations (3) and (4) above also list third-order harmonics. In some embodiments, the third-order harmonics may be desired. However, if not, the effect of such harmonics can be compensated with appropriate filtering. For example, the input signal 12 can be filtered to remove frequency components above frequency $F_1$. Thus, such frequency components would not be present to mix with a frequency at $3*F_1$. Moreover, filtering before a digitizer can remove any higher order frequency components that may otherwise affect the digitized signal due to aliasing.

In the event of interleaving errors due to analog mismatch, hardware adjustments can be made for mixing clock amplitude and phase. The adjustments can then be calibrated to minimize interleave mismatch spurs. Alternatively, or in addition to the above approach, hardware mismatches can be characterized, and a linear, time-varying correction filter can be used to cancel the interleave spurs. Further, in some cases, the switches might not always operate perfectly. For example, an errant switch might spend more time in one direction than the other, thereby causing a skewed duty cycle. The digital harmonic mixers 46 and 52 can be configured to compensate for phase or amplitude errors that may be present in the analog harmonic signals 20 and/or 26 by making subtle adjustments to the amplitude or phase of the digital harmonic signals 48 and/or 54.

Figure 10:
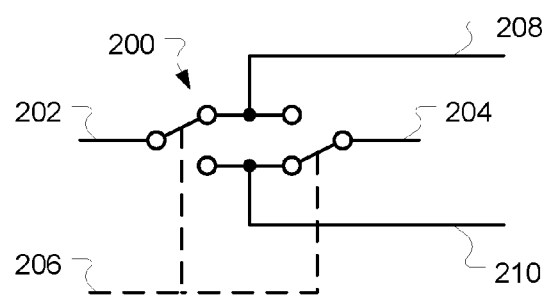

FIG. 10 is an example of another harmonic mixer. A switching circuit 200 is configured to switch two input signals 202 and 204 alternatively to outputs 208 and 210 in response to the control signal 206. The control signal 206 can again be a square wave or other similar signal to enable the switches of the switching circuit 200 to switch. During one half-cycle of the control signal 206, input signal 202 is switched to output 208 while input signal 204 is switched to output 210. During the other half-cycle, the input signal 202 is switched to output 210 while input signal 204 is switched to output 208.

In some embodiments, the input signal 204 can be an inverted and scaled version of the input signal 202. The result of such inputs and the switching described above is a rebalancing of the DC and other harmonics from the levels described above with respect to the switch 180 of FIG. 9A. For example, input signal 204 can be a fractional inverted version of the inputs signal 202. Instead of switching between 1 and 0 with the switch 180 of FIG. 9A, the effective output of outputs 208 and 210 can be switching between 1 and $(2-\pi)/(2+\pi)$, for example. Thus, the amplitude and DC level can be adjusted as desired to create the desired balance between the harmonics.

Figure 11:
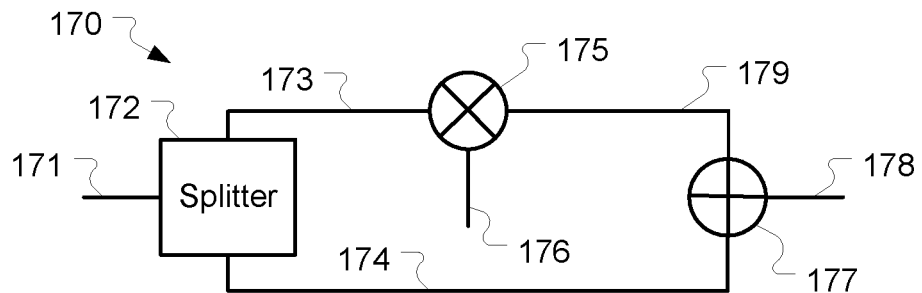

FIG. 11 illustrates an alternative example of a harmonic mixer. The harmonic mixer 170 includes a splitter 172, a mixer 175, and a combiner 177. The splitter 172 is configured to split an input signal 171 into signals 173 and 174. Signal 174 is input to the combiner 177. As signal 174 is not mixed with another signal, signal 174 can act as the DC component of a harmonic mixer described above.

Signal 173 is input to the mixer 175. A signal 176 is mixed with the signal 173. In some embodiments, signal 176 can be a single harmonic, such as the frequency $F_1$ described above.

If additional harmonics are desired, additional mixers can be provided and the respective outputs combined in combiner 177.

In another embodiment, the signal 176 can include multiple harmonics. As long as the bandwidth of the ports of the mixer 175 can accommodate the desired frequency ranges, a single mixer 175 can be used. However, since the DC component of the harmonic signals described above is passed to the combiner 177 by a different path, the ports of the mixer receiving signals 173 and 176 need not operate to DC. Accordingly, a wider variety of mixers may be used. Once the signals 179 and 174 are combined in the combiner 177, the output signal 178 can be substantially similar to a mixed signal described above.

In some embodiments, the splitter 172 can, but need not split the input signal 171 symmetrically. For example, a side of the splitter that outputs signal 174 may have a bandwidth that is at or above the filtering cutoff frequency described above. A side of the splitter 172 that outputs signal 173 can have a frequency range centered on a harmonic of the signal 176 and a bandwidth of twice or greater of the filtering cutoff frequency described above. In other words, the frequency response of the splitter 172 need not be equal for each path and can be tailored as desired.

Figure 12:
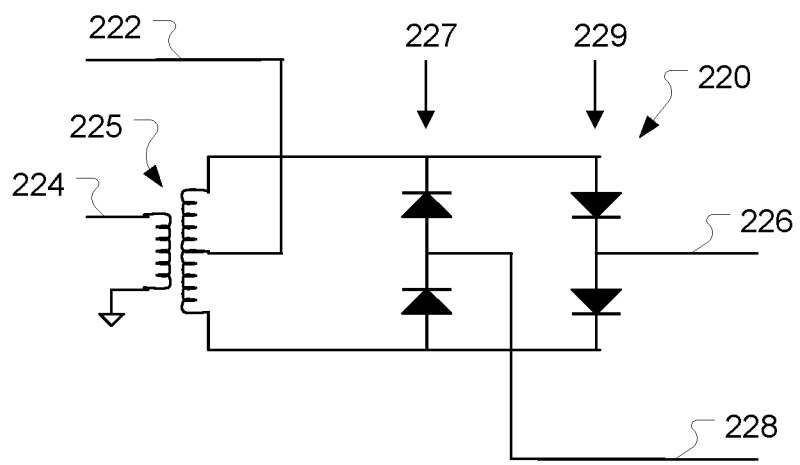

FIG. 12 is another example of a harmonic mixer of the general topology of FIG. 9A. In this embodiment, a harmonic signal 224 can be input to a diode ring 220 similar to a mixer through transformer 225. The input signal 222 can be input to a tap of the transformer 225. Accordingly, depending on the harmonic signal 224, the input signal 222 can be switched between outputs 226 and 228. For example, the harmonic signal 224 causes either the left diodes 227 to turn on when the bottom of the transformer is positive and the top is negative, or the right diodes 229 to turn on when the polarity of the transformer is reversed. In this manner, the input signal 222 is alternately routed to the output 228 and the output 226. In some embodiments, an additional diode ring could be used to terminate the outputs and/or inject an inverted portion of a sub-band of the input signal 222 to achieve a higher gain, compensate for imbalanced harmonics, or the like, as in the topology of FIG. 10.

In some embodiments, two paths and two overlapping sub-bands are implemented. However, as mentioned above, any number of paths and sub-bands can be used. In such embodiments, the number of harmonics used can be equal to one plus one half of a number of sub-bands, rounded down, where DC is included as a zero-order harmonic. For example, for three sub-bands, only two harmonics can be used. Using the above frequency ranges as an example, the first-order harmonic can frequency shift frequencies higher than frequency Ft to the baseband sub-band. The first-order harmonics of the harmonic signals can be phased with 120 degree relative phase shifts.

Accordingly, when a sub-band is in the proper frequency range during combination in the combiner 58, the sub-band spectra will have the same phase shift, such as a 0 degree relative phase shift. In contrast, the three components of a sub-band in the incorrect frequency range would offset in phase from one another by 120 degrees. The resulting spectra would destructively combine to eliminate the incorrect sub-band. As further paths and sub-bands are added, the harmonics of the harmonic signals can be appropriately phased. In some embodiments, the relative phase shifts of the harmonic signals can be spaced in phase by time shifts of one period divided by the number of sub-bands.

Although embodiments have been described above where digitized signals can be substantially immediately processed, such processing after digitization can be deferred as desired. For example, the digitized data from digitizers 30 and 32 can be stored in a memory for subsequent processing.

Moreover, although the digital filtering, mixing, and combining have been described as discrete operations, such operations can be combined, incorporated into other functions, or the like. In addition, as the above discussion assumed ideal components, additional compensation, can be introduced into such processing as appropriate to correct for non-ideal components. Furthermore, when processing the digitized signals, changing frequency ranges, mixing, and the like can result in a higher sample rate to represent such changes. The digitized signals can be upsampled, interpolated, or the like as appropriate.

As mentioned above, the digital harmonic mixers 46 and 52 can be configured to compensate for phase errors that may be present in the analog harmonic signals 20 and/or 26 by making subtle adjustments to the amplitude or phase of the digital harmonic signals 48 and/or 54. Shifts in delays of various components over time or temperature may cause unacceptable amounts of phase shift. Delay shifts in the circuitry generating the analog harmonic signals, in the analog mixers, and/or in the analog-to-digital channel aperture would all contribute to a phase error between the analog mixers 18 and 24 and the digital mixers 46 and 52, respectively.

If the phase error is uncorrected, the mixing phase error will effect an equal phase error in the frequency components within the upper bands of the reconstructed waveform, leading to distortion in the step response of the system. Additionally, amplitude errors will result for frequency components within the cross-over band, as the unconverted and the twice-converted vectors representing the frequency component, as will be discussed in more detail below, will not be properly aligned when added together near the end of the reconstruction process.

Figure 13:
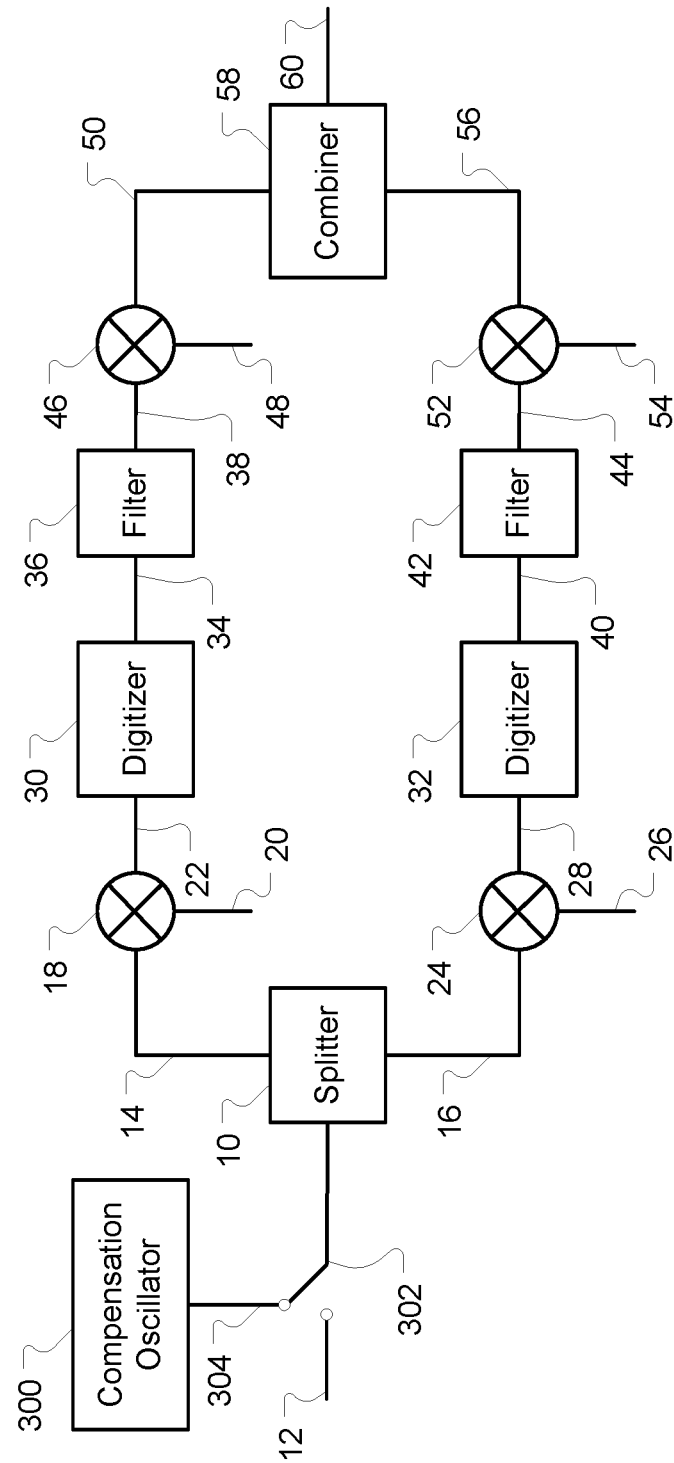
FIG. 13 is an embodiment of a block diagram of the asynchronous time interleave (ATI) digitizer of FIG. 1 with a compensation oscillator.

Some embodiments of the test and measurement instrument contain a compensation oscillator 300 and a switch 302 as shown in FIG. 13. A compensation oscillation signal 304 from the compensation oscillator 300 can be switched into the input of an ATI digitizer, described above, via switch 302. The compensation oscillator 300 can be used to determine the phase and amplitude errors, as discussed in more detail below, so the phase and amplitude errors can be removed.

The compensation oscillator 300 and switch 302 are included within an integrated circuit for the ATI digitizer so the compensation oscillator 300 adds little cost or power overhead to the system. Further, the compensation oscillator 300 is tunable over a frequency range wider than the integrated circuit process uncertainty of the center frequency, ensuring that the system can find an appropriate tune voltage to place the compensation oscillator 300 frequency within the cross-over band.

Since the frequency of the compensation signal 304 from the compensation oscillator 300 is tuned to be within the cross-over band, the compensation signal 304 travels through an ADC channel of the ATI digitizer both at its original frequency and as a down-converted and subsequently digitally-up-converted frequency component. The phase of the original frequency component of the compensation signal 304 is not impacted by the phase error between the analog and digital harmonic mixing signals, but the phase of the twice-converted component is impacted.

A phase error value can be determined based on comparing the original frequency component of the compensation signal 304 that was not affected by the phase error and the twice-converted component which has been affected by the phase error traveling through one ADC channel of the ATI digitizer. Comparing these values provides the phase error value between the analog and digital mixers in that ADC channel. The phase error can then be used to adjust the mixing function of either the analog mixer 18 or the digital mixer 46, if in the upper ADC channel. Adjusting the mixing function of one of the mixers 18 or 46, or if in the lower ADC channel in FIG. 13, mixers 24 and 52, allows for the phase error to be removed from the reconstructed waveforms. Alternatively, the phase error may be removed by changing the delay of digital filter 36 in the upper ADC channel or digital filter 42 in the lower ADC channel, as a phase shift in either input to the digital mixers 46 and 52 will effect a phase shift in the output.

Preferably, the compensation oscillator 300 compensation signal 304 is switched into the input via switch 302 immediately after an acquisition of a signal to be tested, rather than beforehand, as the measurement of the phase error can be applied to correct the mixing functions of the digital mixers 46 and 52 or the delays of digital filters 36 and 42. The information is not needed until the ATI reconstruction of the signal occurs post-acquisition.

Figure 14:
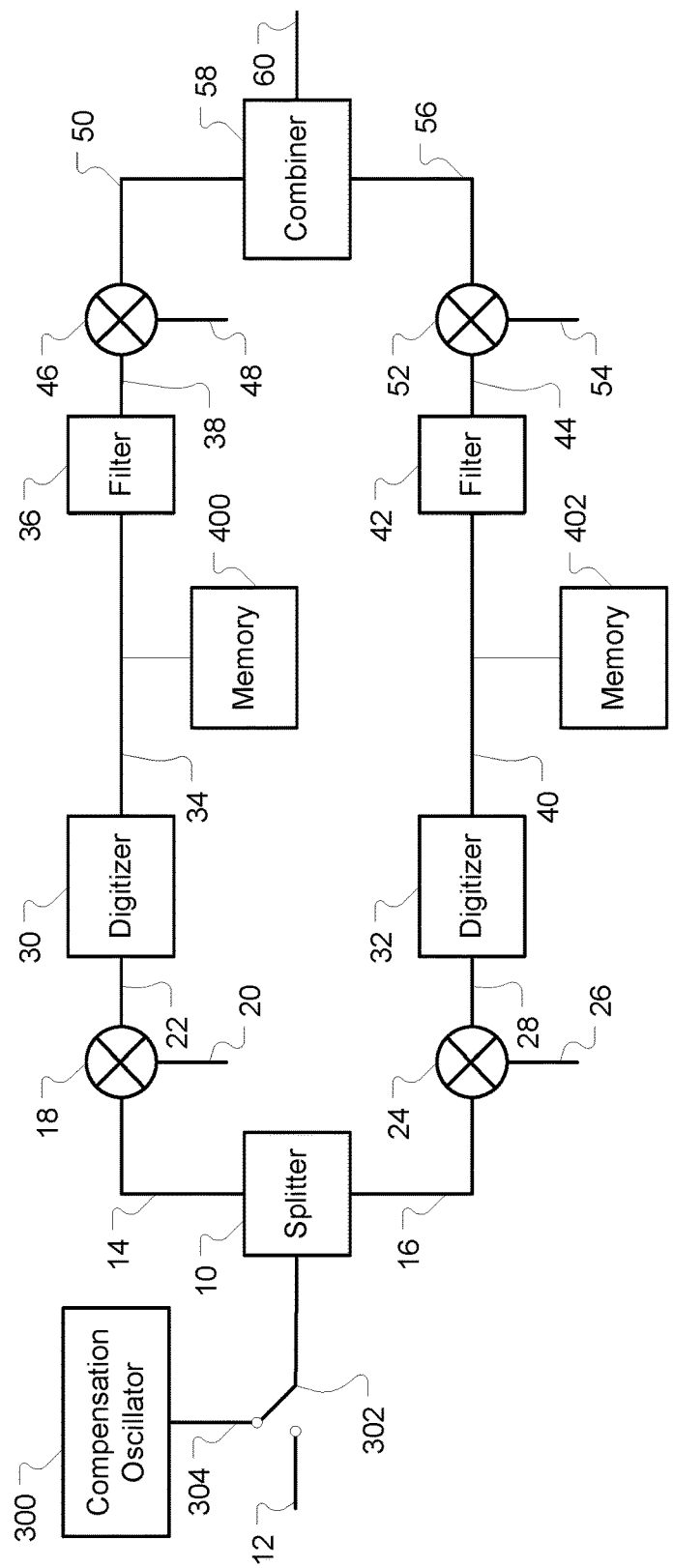
FIG. 14 is another embodiment of a block diagram of the ATI digitizer of FIG. 1 with a compensation oscillator.

As seen in FIG. 14, a memory 400 may be provided between digitizer 30 and filter 36 in the upper ADC channel and a memory 402 between digitizer 32 and filter 42 in the lower ADC channel. An acquisition can be performed and the digitized mixed signal 34 or the digitized mixed signal 40 can be stored in memories 400 and 402, respectively, before being sent to filters 36 and 42, respectively.

After the digitized mixed signals 34 and 40 have been stored in memories 400 and 402, respectively, switch 302 can be triggered to automatically provide the compensation signal 304 from the compensation oscillator 300 without a user input. For example, a digital signal processor (DSP), microprocessor, programmable logic device, general purpose processor, or other processing system with appropriate peripheral devices as desired can be used to automatically switch to the compensation signal 304 from the compensation oscillator 300. The phase error can be determined as discussed above, and the mixing functions of the digital mixers 46 and 52 or the delays of digital filters 36 and 42 can be adjusted. Once the mixing functions or filter delays have been modified based on the phase error, then the digitized mixed signals 34 and 40 can be processed through the remaining portions of the ADC channels as discussed above with respect to FIG. 1.

Running the compensation after the acquisition minimizes the opportunity for a phase drift between the compensation and acquisition modes. A compensation run before a signal acquisition may be performed an arbitrary time before a signal acquisition, as there is no way of knowing how long an acquisition will be running waiting for a trigger event. However, if the system phase stability is sufficiently good, then the compensation process can be run before acquisition. Further, if a user decides a compensation is desired, the user may begin the compensation via a menu on the test and measurement instrument.

When the compensation oscillator 300 is enabled, the input signal acquisition is automatically switched off via switch 302 and replaced with the compensation signal 304, allowing the compensation to run without requiring user interaction. Further, the compensation signal 304 may be switched on after a trigger event has been detected, without user input, using a processor, or the like, as discussed above. The compensation oscillator 300 can also automatically be switched on after every signal acquisition to provide the compensation signal 304 to determine a phase or amplitude error.

Digitizers 30 and 32 may suffer from phase drift between their respective sampling clocks, such that the unconverted signals passing through the analog mixers are not sampled at the same time. Also, digitizers 30 and 32 may themselves employ interleaving techniques, such as synchronous time interleaving, to achieve their effective sample rates. In that case, the interleaved acquisition pipes within digitizers 30 and 32 may similarly suffer from phase drift of their respective sample clocks. Compensation oscillator 300 can also be used to provide a compensation signal 304 through the ATI front-end to each ADC channel for the purpose of determining phase errors of acquisition pipes within and/or between the ADC channels. This can be accomplished by tuning the compensation oscillator 300 out of the cross-over band so that only one tone is output from the analog mixers 18 and 24 within the bandwidth of each ADC channel. Alternatively, if compensation oscillator 300 frequency is left within the cross-over band, a sine-fit algorithm used to measure the phases of each ADC pipe could be set to fit just the unconverted frequency component and not an image component, or vice versa.

The measured phase errors may be used to adjust the phase response of digital filters 36 and 42 to correct for the impact of the sampling time errors. Adjusting the delay of one digital filter with respect to the other digital filter may compensate for phase error between the digitizers 30 and 32. If the digitizers 30 and 32 are internally interleaved, pipe-dependent phase shifts may be applied within each digital filter 36 and 42 to compensate phase errors within each digitizer 30 and 32, respectively. Alternatively, the phase errors could be used to adjust the sample-clock timing of the acquisition pipes to minimize the error in subsequent acquisitions.

The compensation oscillator 300 can be built from a cross-coupled NPN differential pair amplifier, to generate negative resistance, and a shorted transmission-line stub, to set a nominal frequency. The compensation oscillator 300 is turned on and tuned by setting an emitter current in the differential pair amplifier. Once the current is high enough to provide sufficient transconductance to support oscillation, further increase in current serves to increase the devices' input capacitance, which in turn loads the transmission-lines and lowers the resonant frequency. That is, the tunable compensation oscillator 300 is tuned predominantly through varying an input capacitance of at least one bipolar junction transistor.

Use of the input capacitance tuning provides a relatively large and linear tune range compared to varactor tuning at these frequencies. The large tune range is helpful to overcome process modeling uncertainty and process variability. If the large tune range of the compensation oscillator 300 causes excessive frequency instability within the duration of the compensation acquisition, the acquired compensation record can be split into multiple shorter segments and analyzed for phase errors using separate sine-fits with potentially different frequencies in each of the segments. The measured phase error between the unconverted and twice-converted components in each segment represents the phase error between the analog and digital harmonic signals, and is independent of the exact frequency of the compensation signal used. Thus the results of the segment phase error measurements may be averaged to gain the same noise immunity as the single long record.

As mentioned briefly above, an amplitude error can also be determined using the compensation oscillator 300. To determine the amplitude error, the input of the harmonic mixer, also referred to as an ATI digitizer, such as the digitizer illustrated in FIG. 13, may be swept with the compensation signal 304 over at least two frequencies symmetrically opposed within the cross-over band. When the input frequency is below the center of the cross-over band, the ratio of amplitudes of the digitized signal at the converted frequency and the input frequency will be the product of the conversion gain and the digitizer frequency response roll-off. When the input frequency is symmetrically above the center of the cross-over band, the ratio of amplitudes of the digitized signal at the converted frequency and the input frequency will be the ratio of the conversion gain and the digitizer frequency roll-off. The geometric mean of these two amplitude ratios then represents the conversion gain. The amplitude of the analog mixing functions 20, 26 or the digital mixing functions 48, 54 may then be adjusted to bring the conversion gain to the desired value, generally 1.0.

Figure 15:
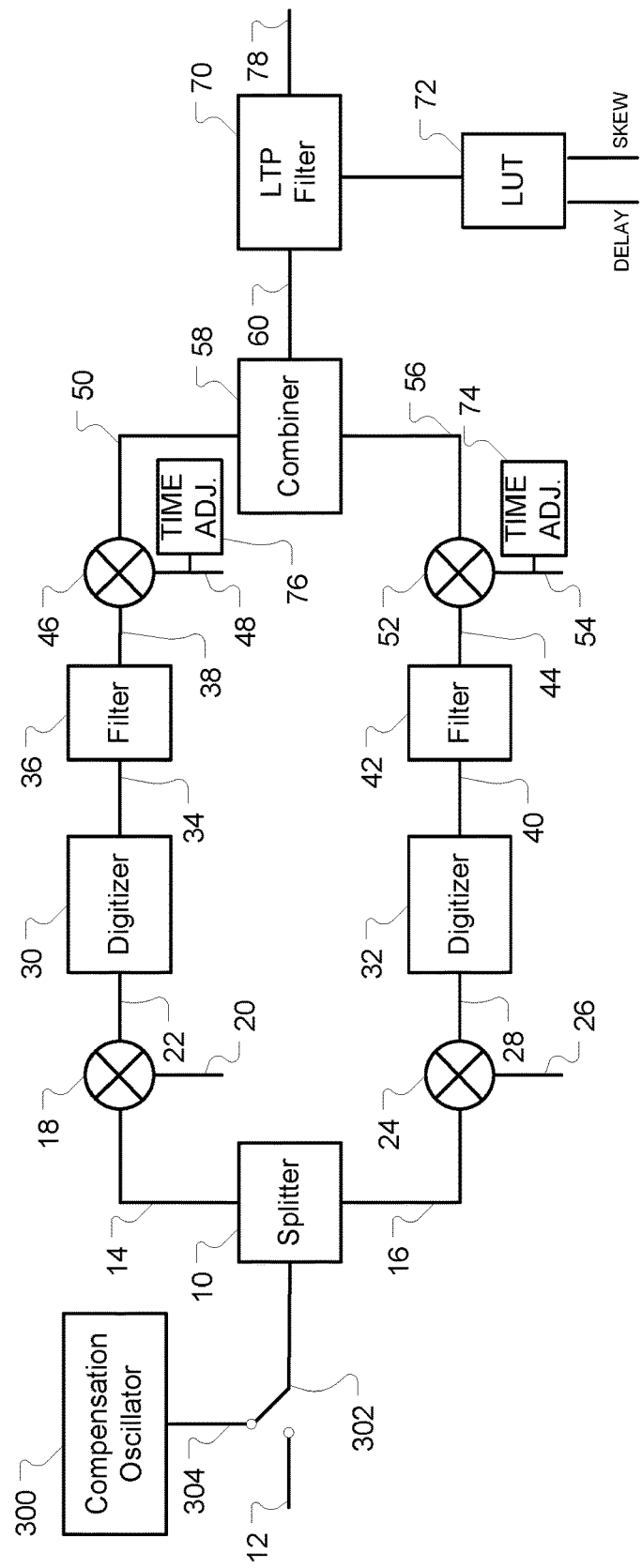
FIG. 15 is a block diagram of an embodiment of the ATI digitizer of FIG. 1 including a calibration system according to embodiments of the invention.

With reference to FIGS. 14 and 15, embodiments of the invention also include systems for performing real-time calibration of digitizing systems in situations where an internal compensation oscillator, such as the oscillator 300 in FIGS. 13 and 14 may not be capable of generating signals that span the entire bandwidth of the input signal 12. For example, for a test and measurement system that accepts input signals having frequencies up to 70 GHz, the oscillator 300 may produce signals in the range of, for example, 30 to 40 GHz.

Further embodiments provide a system and methods to compensate for hardware errors, such as those that vary as a function of input frequency that therefore are best characterized over the full input range. As described below, embodiments of the invention allow for full-range characterization during a factory calibration, and further use the compensation oscillator to measure a subset of hardware errors, preferably delay and skew, and use the measured hardware errors as an index into a factory look-up table that stores pre-determined sets of compensating filter coefficients.

As described above, hardware errors can be characterized, and a linear, time-varying correction filter can be used to cancel the interleave spurs. For example, a linear, time-varying filter, such as a linear, time-periodic or "LTP" filter 70 may be inserted at the end of the reconstruction DSP chain, such as at the output of the combiner 58, to correct hardware mismatch errors. Such hardware errors may include those between the interleaved ADC sub-channels within each ADC channel, and between the two ADC channels themselves. An LTP correction filter can also correct more complicated hardware errors than the simple timing errors described above, for example time errors that vary as a function of the input frequency. Although other filter parameters are possible, an example LTP filter 70 has an 80 ps period, matching the sample interval of the interleaved ADC sub-channels and being an integer multiple of the 13⅓ ps period of the mixing clock. In some embodiments, a 75 GHz mixing clock, which is coupled to the mixers, such as mixers 18 and 24, is generated from a 12.5 GHz system clock. Due to hardware imperfections in the frequency multiplier, the generated mixing clock contains some residual spurs at integer multiples of 12.5 GHz besides the desired 6× multiple.

Such mixing spurs create spurs in the digitized record at exactly the same frequencies as spurs produced by ADC sub-channel interleave mismatch, and thus, using techniques described herein, may also be corrected by the same LTP filter topology. However, calibrating the LTP filter to correct for frequency-dependent timing errors and/or clock-spur-related mixing errors requires measuring the hardware errors at multiple input frequencies spanning the full input bandwidth of the digitizer system. It is generally cost-prohibitive to build such full-range signal generation capability into the digitizer system itself, so the calibration of the LTP filter must be performed in the factory with access to a suitable signal source.

Although oscilloscopes such as described here are calibrated at the factory, conditions in which they operate may not match those of the factory. The testing room may change temperature and/or humidity, for example, or the performance of some components may drift over time. In general, the largest hardware drifts for test and measurement systems caused by environmental conditions (temperature and humidity) exhibit themselves in the relative clock phasing of the ADC channels with respect to each other, and with respect to the analog mixing function. To the extent these phases drifted just with temperature, it would be relatively easy to characterize their temperature coefficients and adjust the hardware in real time as a function of a measured temperature. However, it is relatively difficult to accurately measure the amount of humidity absorbed into the printed circuit boards on which the oscilloscope components are formed. Also, some errors caused by environmental conditions could be corrected by adjusting the phases of the digital mixing functions and/or the delays of the digital filters before the digital mixers. Such calibration techniques, however, may not fully correct the change in phase of the signal spurs caused by the unwanted 12.5 GHz harmonics in the 75 GHz analog mixing function with respect to the phase of the ADC sub-channel interleave mismatch spurs which occur at the same frequencies. Thus, as described in more detail below, embodiments of the invention directly monitor the clock phases and skew of clocks driving mixers in the oscilloscope using the built-in calibration oscillator. Then the DSP is modified based on the measured clock phase and skew to account for the measured errors after-the-fact.

Figure 16:
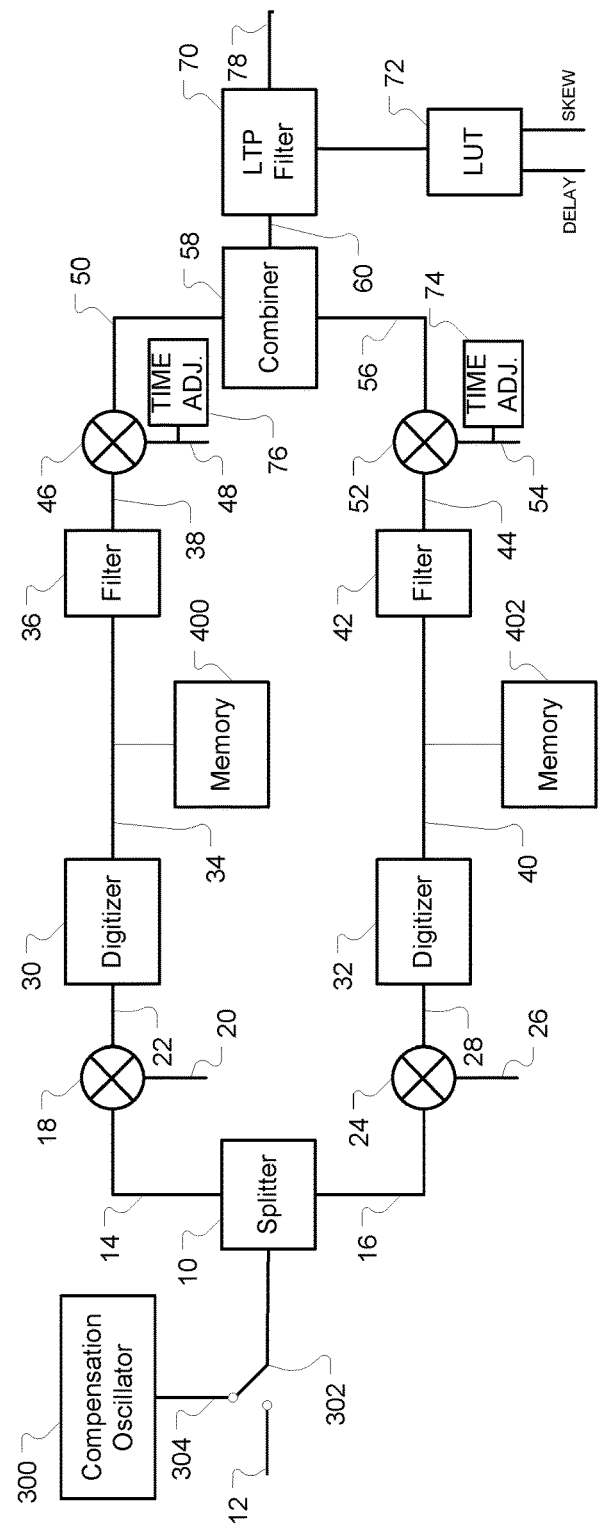
FIG. 16 is a block diagram of another embodiment of the ATI digitizer of FIG. 1 including a calibration system according to embodiments of the invention.

In some embodiments, the modification of the DSP, such as the DSP illustrated in FIGS. 15 and 16 is performed by generating a new set of coefficients for the LTP filter 70. In other embodiments, the modification of the DSP may be performed by adjusting clocks driving the mixers 46, 52, such as by using the time adjustors 74, 76 in FIGS. 15 and 16, and also generating a new set of coefficients for the LTP filter 70. Using either method allows correction for shifts in both clock delay and skew. In one embodiment, clock delay is measured as a delay between the clocks for mixers 18, 24 in the analog domain as compared to the clocks for digitizers 30, 32 in the digital domain. Also, clock skew may be measured by measuring the particular skew between the clocks for digitizers 30, 32 themselves.

For a particular hardware state (temperature, humidity, etc.), an ideal set of coefficients for the LTP correction filter 70 may be calculated by a method such as described in U.S. Pat. No. 8,698,659, which is incorporated by reference herein. However, as set forth in that reference, performing such calculations requires access to a signal source that spans the full frequency range of the digitizer. The frequency range of the compensation oscillator 300, such as illustrated in FIGS. 13 and 14, are generally not tunable over the entire range of the digitizer, and instead is typically tunable over only a portion of the full frequency range. Thus calculating filter coefficients according to techniques described in the '659 patent cannot be used in all cases. Instead, for cases where the compensation oscillator may not include the full range of the digitizer, techniques according to embodiments of the invention may be used.

Embodiments of the invention include a Look Up Table (LUT) 72 coupled to the LTP filter 70, as illustrated in FIGS. 15 and 16. The LUT 72 stores filter coefficients for the LTP filter 70 to correct for various run time conditions. Then, in operation, the run time conditions are communicated to the LUT 72, which selects the appropriate filter coefficients for the LTP filter 70 to correct for the present run time condition.

To initially generate the filter coefficients stored in the LUT 72, the instrument is first factory calibrated using a full-range oscillator. Then, an error condition is artificially introduced into the instrument, such as clock delay and/or clock skew. Next, coefficients for the LTP 70 that correct for the artificially introduced error condition are generated and stored in the LUT 72 and related to the particular error condition. Then, this cycle repeats with a new error condition artificially introduced into the instrument and another set of coefficients for the LTP 70 are generated and stored in the LUT 72 and related to new error condition. This process is repeated as many times as desired, depending on the size of the LUT 72 desired.

Figure 17:
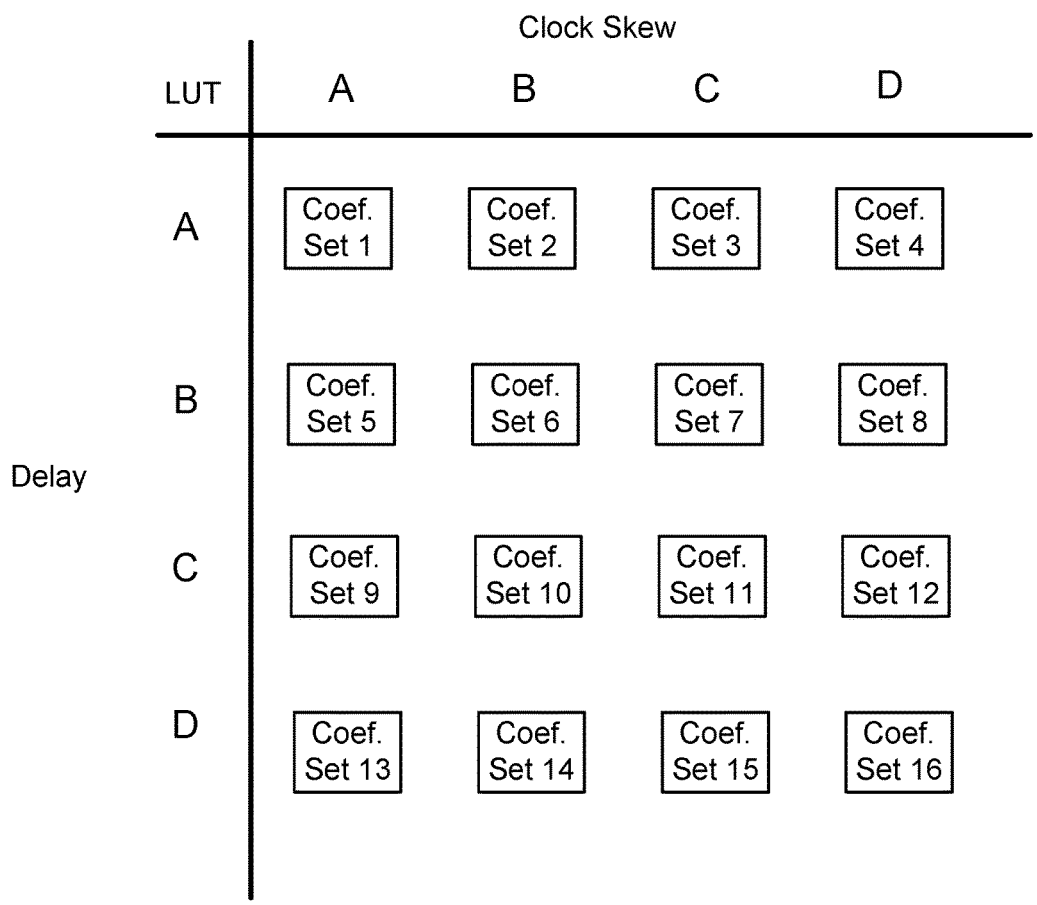
FIG. 17 is a two-dimensional array illustrating how filter coefficients may be stored and indexed during calibration of an ATI digitizer according to embodiments of the invention.

In one embodiment, entries to the LUT 72 are stored based on two measurements, clock delay and clock skew. In such an embodiment the LUT 72 stores various sets of coefficients in a two-dimensional array selected by particular clock delay and skew values. Since clock delay and skew may be independent from one another, it is possible that a particular delay value have multiple different skew values associated to it. Also, the converse is true, where a particular skew value may have coefficients for several different delay values. FIG. 17 illustrates a two-dimensional array storing coefficient values. Various coefficients, such as Coefficient Set 1, Coefficient Set 12, etc. are stored in indexed positions in the two-dimensional array. As described in more detail below, at run time the instrument may measure clock delay and clock skew, and then use the measured values as indices to the LUT to select a particular Coefficient Set. For example, if the delay value D is measured along with clock skew value B, then Coefficient Set 14 is selected from the table. As described above, the coefficient set values, in this example those identified as Coefficient Set 14, which were pre-calculated to compensate for that particular combination of delay and clock skew, are then stored in the LTP 70. In this way the instrument is compensated for the environmental run time conditions.

Clock delay and clock skew values may be positive or negative values. For example, clock delay values "A" and "B" may be negative clock delay, while clock delay values "C" and "D" may be positive clock delay.

Although illustrated as a two-dimensional array, concepts of the invention extend to any number of index values for particular measured values. Also, the two-dimensional array, such as that illustrated in FIG. 17, may additionally include a particular set of coefficients indexed at zero clock delay and zero skew, since it is possible that the instrument stay in or near factory calibration. In one embodiment the LUT 72 includes five different values for measured clock delay and three different values for measured skew, including a central value for zero clock delay and zero skew.

Some embodiments may select the particular coefficient set from the LUT 72 that is closest to the intersection of the measured clock delay and clock skew. Yet other embodiments may use interpolation to generate particular coefficient values that are not exactly indexed. For example, if the clock delay is measured as "A", but the measured skew value falls between values "C" and "D", embodiments may interpolate a set of coefficient values that are "between" Coefficient Set 3 and Coefficient Set 4. Other techniques may also be used to generate coefficients, such as two-dimensional linear interpolation, spline fitting, or other interpolation methods to approximate LTP 70 filter coefficients at the actual measured delay and skew values. Such interpolation allows one to calibrate and store fewer LTP filter coefficient sets in the two-dimensional array LUT 72 for a given level of accuracy, saving factory calibration time.

A particular method to populate the LUT 72 may occur as follows. The LTP filter 70 is calibrated multiple times in the factory. Initially the LTP is calibrated having zero clock delay and zero skew. A nominal set of coefficients are generated for the LUT 72 and stored as the default coefficients. Then, to generate the various coefficient values, the clock phase and skew are intentionally adjusted to be non-zero. For example, one ADC channel is adjusted to sample at a time of (delay+skew/2) and the other ADC channel is adjusted to sample at a time of (delay−skew/2). Then coefficients are generated for the LTP filter 70 to compensate for the combination of delay and skew. This process is repeated at other clock delay values and clock skew values until the LUT 72 is completely populated for conditions likely to be measured in the field. After calibrating and storing LTP filter 70 coefficients in this two-dimensional array, such as the LUT 72, the hardware clock phase controls are returned to their nominal values (delay=skew=0) in a final, factory calibration. At run time, after an acquisition, the calibration oscillator 300 can then be used to measure the actual clock phases, which may have drifted away from their nominal values, calculate the effective delay and skew, and use these values as indices into the two-dimensional array of calibrated LTP filter coefficients, to find the LTP filter coefficients appropriate for the measured clock delay and skew. Then the selected coefficients are selected from the LUT 72 and stored in the LTP filter 70 for proper operation.

In general, compensation is performed after a signal has been acquired by the instrument. For example, the signal is acquired and stored in memory, such as the memory 400, 402 of FIG. 16. Then the compensation oscillator 300 is used to measure clock delay and clock skew. Next the clock delay and clock skew values are used as indices to the LUT 72 and particular coefficients loaded into the LTP filter 70. Then the processing continues and the previously stored signal processed through the remainder of the channel, including the LTP filter 70.

Although compensation is typically performed after signal acquisition, it may also be performed before acquisition. Compensation may also be performed at every signal acquisition, or merely periodically. Compensation may be performed at set intervals. In some embodiments multiple signals may be acquired sequentially and then a single compensation operation is performed and applied to all of the acquired signals. Such compensation may occur before the signals are acquired, or preferably, after.

In cases of frequent acquisitions, there may be insignificant drift in the hardware clock phases from one acquisition to the next. To save time, software may measure the clock phases after each acquisition, but skip the interpolation step and reuse the previous LTP Filter 70 coefficients if the delay and skew measurements were substantially the same as before. This method saves delay introduced by loading the coefficients, as well as any delay introduce by the interpolation techniques described above, if used. Alternatively, if a user requests fast and frequent acquisitions, for instance when using a fast-frame mode, software may bypass use of the calibration oscillator between acquisitions altogether, instead collecting just one calibration burst at the end of the sequence, and using this one burst to determine the LTP coefficients to use for all frames within the sequence.

Although the above embodiments have described updating coefficients to the LTP Filter 70, it is also possible to at least partially compensate for run-time environmental changes by modifying the clocks that drive the digital mixers, such as mixers 46, 52 of FIGS. 15 and 16. As illustrated in FIGS. 15 and 16, a time adjust circuit 76 is coupled to the mixer 46, while a time adjust circuit 74 is coupled to the mixer 52. Adjusting the time adjusters 74, 76 can partially or fully compensate for the clock delay and clock skew, without needing to update the coefficients for the LTP filter 70. In other embodiments it may also be advantageous to combine the technique of updating the phases of the digital mixing functions by using the time adjusters 74, 76, to avoid signal amplitude loss or phase shift in the cross-over region, based on measured ADC channel clock delay with the technique described above to select new coefficients for the LTP filter 70, to minimize interleave spurs, based on measured ADC channel clock skew and delay. If the two approaches are used together at run time, they may also be used together at factory calibration. In other words, when calibrating the multiple coefficients for the LTP filter 70 in the two-dimensional array, the digital mixing function phases may likewise be set based on measured ADC channel clock delay in the same manner they will be set during regular acquisitions.

Although particular embodiments have been described, it will be appreciated that the principles of the invention are not limited to those embodiments. Variations and modifications may be made without departing from the principles of the invention as set forth in the following claims. For example, it is anticipated that a re-ordering of the digital filtering, mixing, and/or combining may allow for more efficient execution of the digital processing while still providing for reconstruction of a digital representation of the input signal.

What is claimed is:

1. A method for generating a compensation value for an asynchronous time-interleaved (ATI) digitizer having an input, a filter, a filter coefficient memory, and an output, the method comprising:
   applying an input signal with known timing characteristics to the input of the ATI digitizer;
   adjusting a clock parameter of the ATI digitizer to a first value;
   generating a first coefficient set for the filter of the ATI digitizer to compensate for a difference between a phase of the input signal and a phase of an output signal of the ATI digitizer; and
   storing the first coefficient set in the filter coefficient memory of the ATI digitizer.

2. The method of claim 1 wherein the clock parameter comprises delay between a clock for an analog mixer of the ATI digitizer and a clock for a corresponding digitizer of the ATI digitizer.

3. The method of claim 1 wherein the clock parameter comprises skew between a clock for a first digitizer of the ATI digitizer and a clock for a second digitizer of the ATI digitizer.

4. The method of claim 1 wherein storing the first coefficient set in the filter coefficient memory comprises storing the first coefficient set in a Look Up Table (LUT) at an index of the first value of the clock parameter.

5. The method of claim 1 wherein the clock parameter comprises clock delay and clock skew.

6. The method of claim 5 wherein storing the first coefficient set in the filter coefficient memory comprises storing the first coefficient set in a two-dimensional array Lookup Table (LUT) indexed at the first value of clock delay and the first value of clock skew.

7. The method of claim 1, further comprising:
   adjusting the clock parameter of the ATI digitizer to a second value;
   generating a second coefficient set for the filter of the ATI digitizer to compensate for a difference between a phase of the input signal and a phase of an output signal of the ATI digitizer; and
   storing the second coefficient set in the filter coefficient memory of the ATI digitizer.

8. The method of claim 7 wherein adjusting the clock parameter of the ATI digitizer to a second value introduces an error condition into the ATI digitizer.

9. The method of claim 7 wherein the first clock parameter value is nominally zero and the second clock parameter value is non-zero.

10. The method of claim 7, further comprising repeating the adjusting, generating, and storing steps for each of an additional number of clock parameter values, wherein the number of additional clock parameter values is selected to cover a range of clock parameters caused by an expected range of environmental operating conditions for the ATI digitizer.

* * * * *